US007669692B2

(12) United States Patent
Hawkins

(10) Patent No.: US 7,669,692 B2
(45) Date of Patent: Mar. 2, 2010

(54) SOUND DIFFUSER

(76) Inventor: James W. Hawkins, 1703 1/2 - 256th St., Lomita, CA (US) 90717

( * ) Notice: Subject to any disclaimer, the term of this patent is extended or adjusted under 35 U.S.C. 154(b) by 32 days.

(21) Appl. No.: 12/017,195

(22) Filed: Jan. 21, 2008

(65) Prior Publication Data

US 2009/0183942 A1 Jul. 23, 2009

(51) Int. Cl.
*H05K 5/00* (2006.01)

(52) U.S. Cl. ........................ 181/155; 181/152; 181/148; 181/176

(58) Field of Classification Search ................. 181/155, 181/152, 148, 176
See application file for complete search history.

(56) References Cited

U.S. PATENT DOCUMENTS 3,679,022 A * 7/1972 Ohashi ....................... 181/199
4,133,975 A 1/1979 Barker, III
4,424,881 A * 1/1984 Hattori ....................... 181/155
5,115,882 A * 5/1992 Woody ....................... 181/144
5,641,106 A * 6/1997 Slaughter et al. ............ 224/324
6,009,972 A * 1/2000 Choi et al. .................. 181/155
6,257,365 B1 7/2001 Hulsebus, II
6,499,723 B1 * 12/2002 McNarry et al. ............ 254/213
7,466,837 B2 * 12/2008 Nakamura .................. 381/337
2005/0072625 A1 * 4/2005 Christenson ................ 181/210
2006/0018499 A1 * 1/2006 Guyot et al. ................ 381/347
2007/0064958 A1 * 3/2007 Nakamura ................. 381/71.1

* cited by examiner

*Primary Examiner*—Jeffrey Donels
*Assistant Examiner*—Forrest M Phillips
(74) *Attorney, Agent, or Firm*—Dale J. Ream

(57) ABSTRACT

A sound diffuser includes a front plate defining a plurality of sound exit holes. An outer frustoconical wall extends from the front plate, the outer frustoconical wall decreasing in diameter from the front plate. An inner frustoconical wall extends from the outer frustoconical wall toward the front plate, the inner frustoconical wall decreasing in diameter toward the front plate and defining a sound entry opening spaced apart from the front plate. A plurality of legs are coupled to at least one of the front plate and the outer frustoconical wall, the legs extending away from the front plate to contact a speaker cover. First and second straps operatively extend from the front plate, the first strap having a distal end with a fastener for connection to a speaker case. The second strap also has a distal end with a fastener for connection to the speaker case.

7 Claims, 4 Drawing Sheets

SOUND DIFFUSER

BACKGROUND OF THE INVENTION

This invention relates generally to sound modifying device and, more particularly to a sound diffuser for evenly distributing sound emanating from a speaker through a room.

Guitar amplifiers may produce harsh tones from the center of the speaker as well the speakers themselves unevenly distributing the sound throughout a room. The sound may be unevenly distributed simply because the sound is transmitted straight out from the speakers rather than in all directions such that persons who are positioned at angle relative to the speaker may hear less than a full range of acoustical sound or may experience the undesirable harsh tones.

Various devices have been proposed in the art for attempting to diffuse or evenly distribute sound exiting from a speaker. Although assumably effective for their intended purposes, the existing devices do not optimize the sound distribution or are not user-friendly in use. The existing devices do not easily attached and removed from speakers or do not provide optimal geometry for substantially eliminating harsh tones and evenly distributing sound emanating from a speaker.

Therefore, it would be desirable to have a sound diffuser that produces desirable acoustical effects and avoids unwanted ones. Further, it would be desirable to have a sound diffuser that easily mounts to most types of amplifiers. In addition, it would be desirable to have a sound diffuser that evenly distributes sound such that sound quality is optimized.

SUMMARY OF THE INVENTION

Accordingly, a sound diffuser according to the present invention includes a front plate defining a plurality of sound exit holes. An outer frustoconical wall extends from the front plate, the outer frustoconical wall decreasing in diameter from the front plate. An inner frustoconical wall extends from the outer frustoconical wall toward the front plate, the inner frustoconical wall decreasing in diameter toward the front plate and defining a sound entry opening spaced apart from the front plate. A plurality of legs are coupled to at least one of the front plate and the outer frustoconical wall, the legs extending away from the front plate to contact a speaker cover. First and second straps operatively extend from the front plate, the first strap having a distal end with a fastener for connection to a speaker case. The second strap also has a distal end with a fastener for connection to the speaker case.

Therefore, a general object of this invention is to provide a sound diffuser that acoustically modifies the harsh tones of sound waves generated by a speaker.

Another object of this invention is to provide a sound diffuser, as aforesaid, that evenly distributes sound generated by a speaker.

Still another object of this invention is to provide a sound diffuser, as aforesaid, that provides a structure having a unique geometry and material construction that modifies acoustic sound waves.

Yet another object of this invention is to provide a sound diffuser, as aforesaid, that is easily attached to one or more speakers.

A further object of this invention is to provide a sound diffuser, as aforesaid, that is easy to use and economical to produce.

Other objects and advantages of this invention will become apparent from the following description taken in connection with the accompanying drawings, wherein is set forth by way of illustration and example, embodiments of this invention.

DESCRIPTION OF THE PREFERRED EMBODIMENT

A sound diffuser according to the present invention will now be described in detail with reference to FIG. 1 through FIG. 4*c* of the accompanying drawings. More particularly, the sound diffuser 100 includes a diffusing element 110 and first and second straps 140*a*, 140*b*.

Figure 2A:
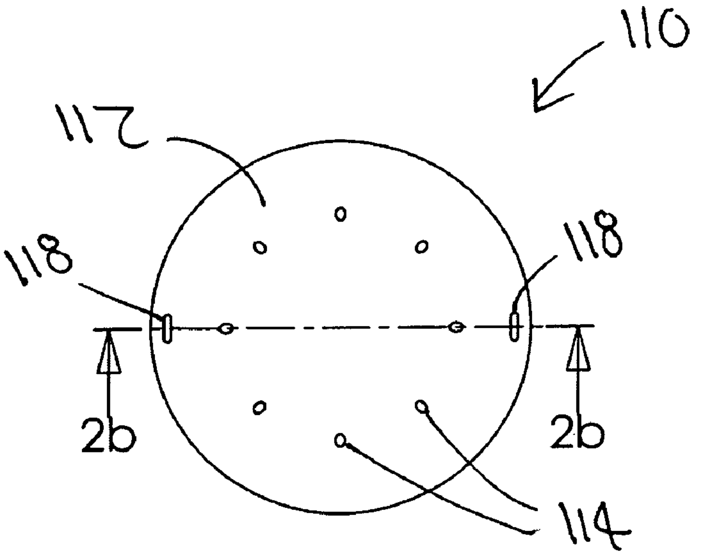
FIG. 2*a* is a front view of the sound diffuser as in FIG. 1.
Figure 2B:
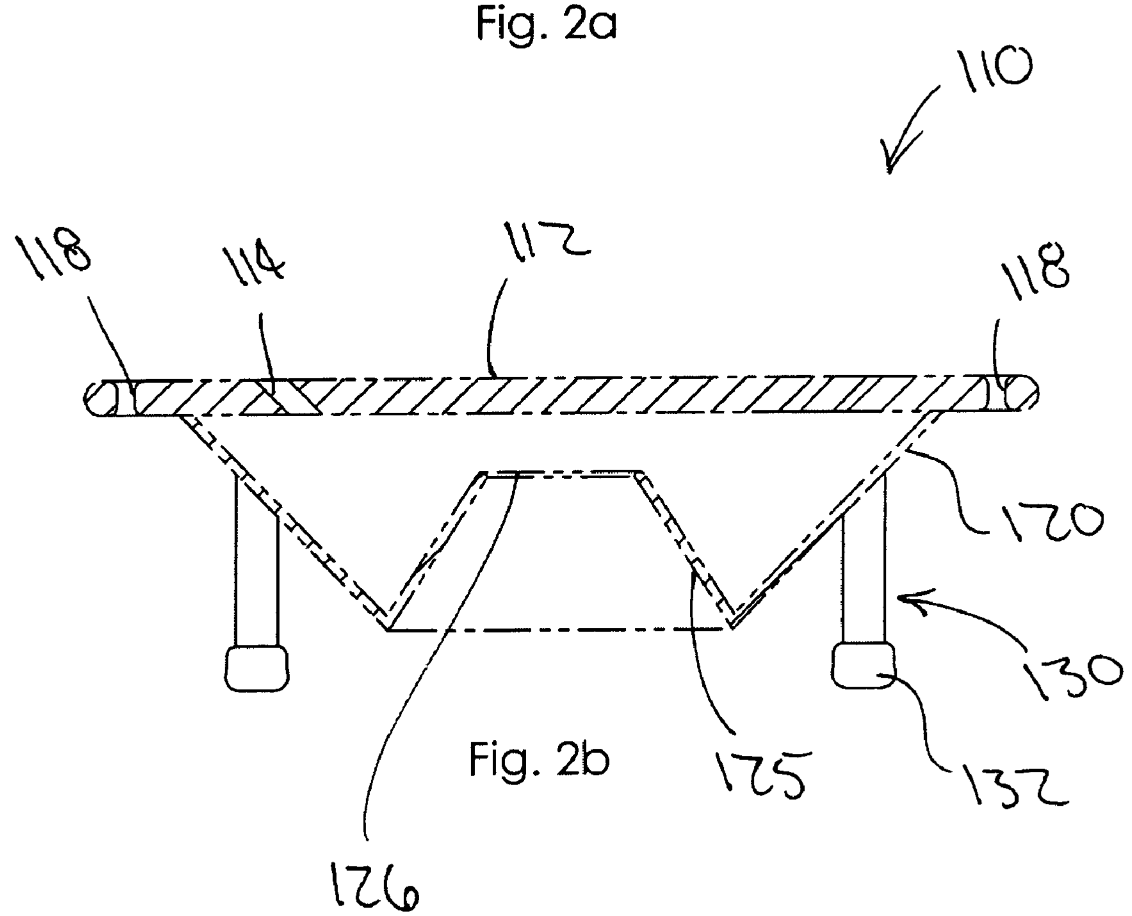
FIG. 2*b* is a sectional view taken along line 2*b*-2*b* of FIG. 2*a;*

As shown in FIGS. 2*a* and 2*b*, the diffusing element 110 includes a front plate 112, an outer wall 120, and an inner wall 125. The front plate 112 defines a plurality of sound exit holes 114 and may be generally planar as shown in FIG. 2*b*. The sound exit holes 114 may be uniformly spaced about a central point. In FIG. 2*a*, for example, the sound exit holes 114 are spaced approximately forty-five degrees radially about an imaginary center point. It should be apparent to one of ordinary skill in the art that many ways of uniformly spacing holes exist and may be incorporated herein.

The outer wall 120 (FIG. 2*b*) extends from the front plate 112 and decreases in diameter as it extends from the from the front plate 112. As shown in FIG. 2*b*, the outer wall 120 may preferably be a frustoconical outer wall. The inner wall 125 (FIG. 2*b*) extends from the outer wall 120 toward the front plate 112 and defines a sound entry opening 126 spaced apart from the front plate 112. The inner wall 125 decreases in diameter as it extends from the outer wall 120, and the inner wall 125 may preferably be a frustoconical inner wall as shown in FIG. 2*b*. The inner wall 125 has an imaginary center axis, and the sound entry opening 126 may be centered about the imaginary center axis. Further, the sound entry opening 126 may be generally parallel to the front plate 112 and may terminate the inner wall 125 (FIG. 2*b*). The sound exit holes 114 may be angled toward the imaginary center axis of the inner wall 125, or in other words, toward the sound entry opening 126 (FIG. 2*b*). The front plate 112, the outer wall 120, and the inner wall 125 may be constructed of sound-reflective material, such as clear acrylic plastic, for example.

As shown in FIG. 2*b*, a plurality of legs 130 are coupled to the front plate 112 and/or the outer wall 120. The legs 130 extend away from the front plate 112 to contact a speaker cover 12 (FIG. 3) with the inner and outer walls 125, 120 being between the front plate 112 and the speaker cover 12. The legs 130 may include flexible ends 132 to prevent or reduce vibration of the legs 130 apart from the speaker cover 12. The flexible ends 132 may be constructed of rubber or other appropriate materials.

Figure 1:
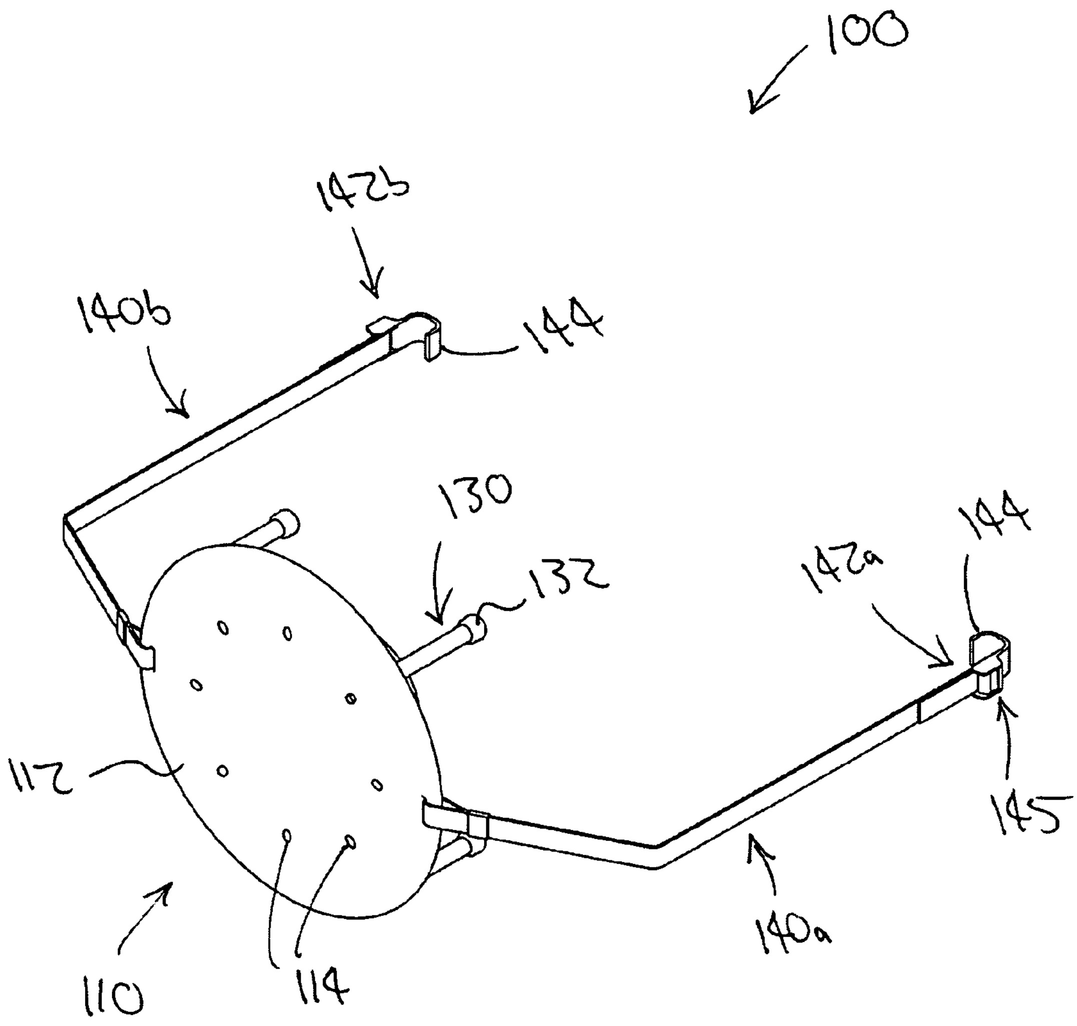
FIG. 1 is a perspective view of a sound diffuser according to a preferred embodiment of the present invention.
Figure 3:
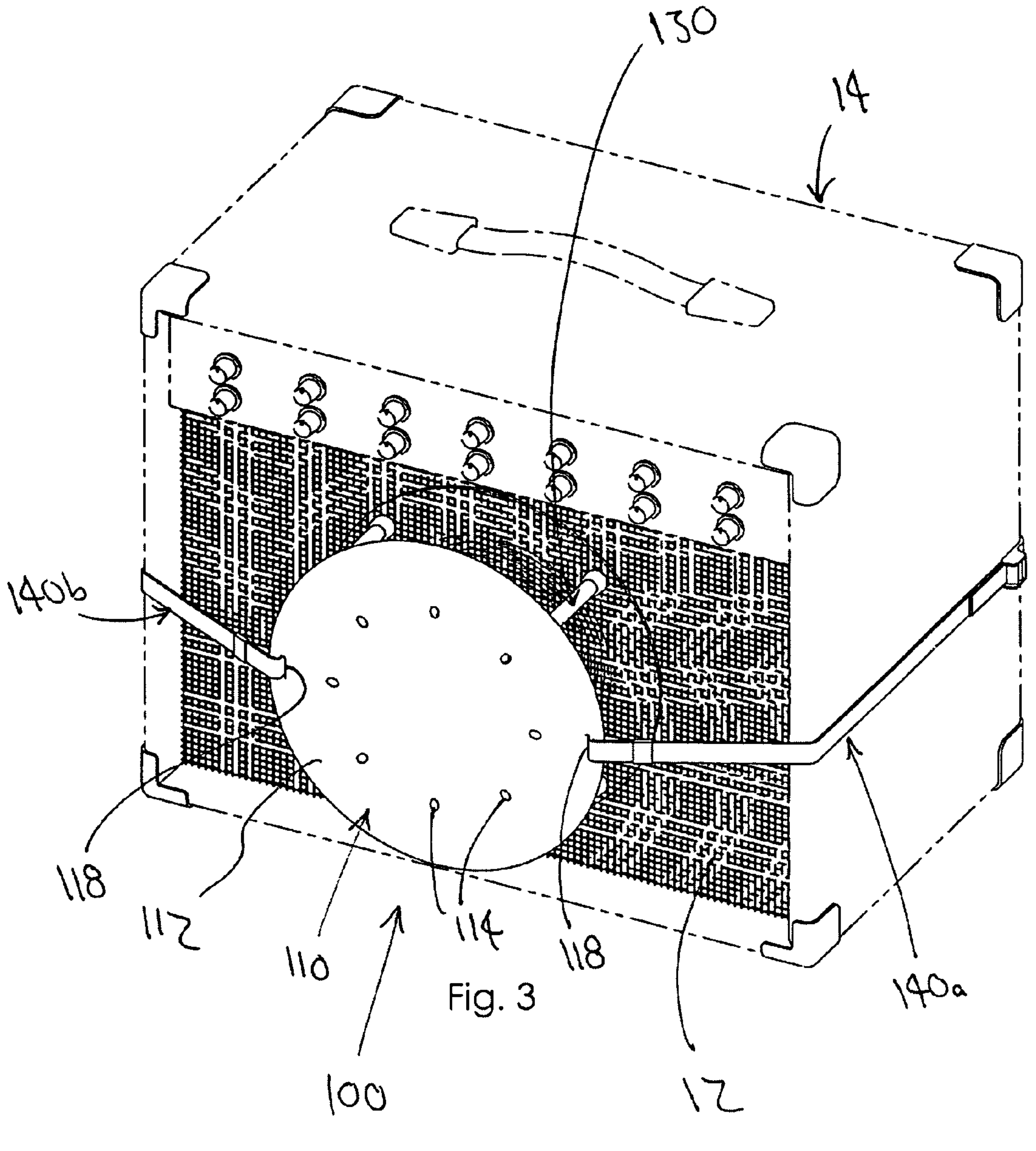
FIG. 3 is a perspective view of the sound diffuser as in FIG. 1 attached to a speaker.
Figure 4A:
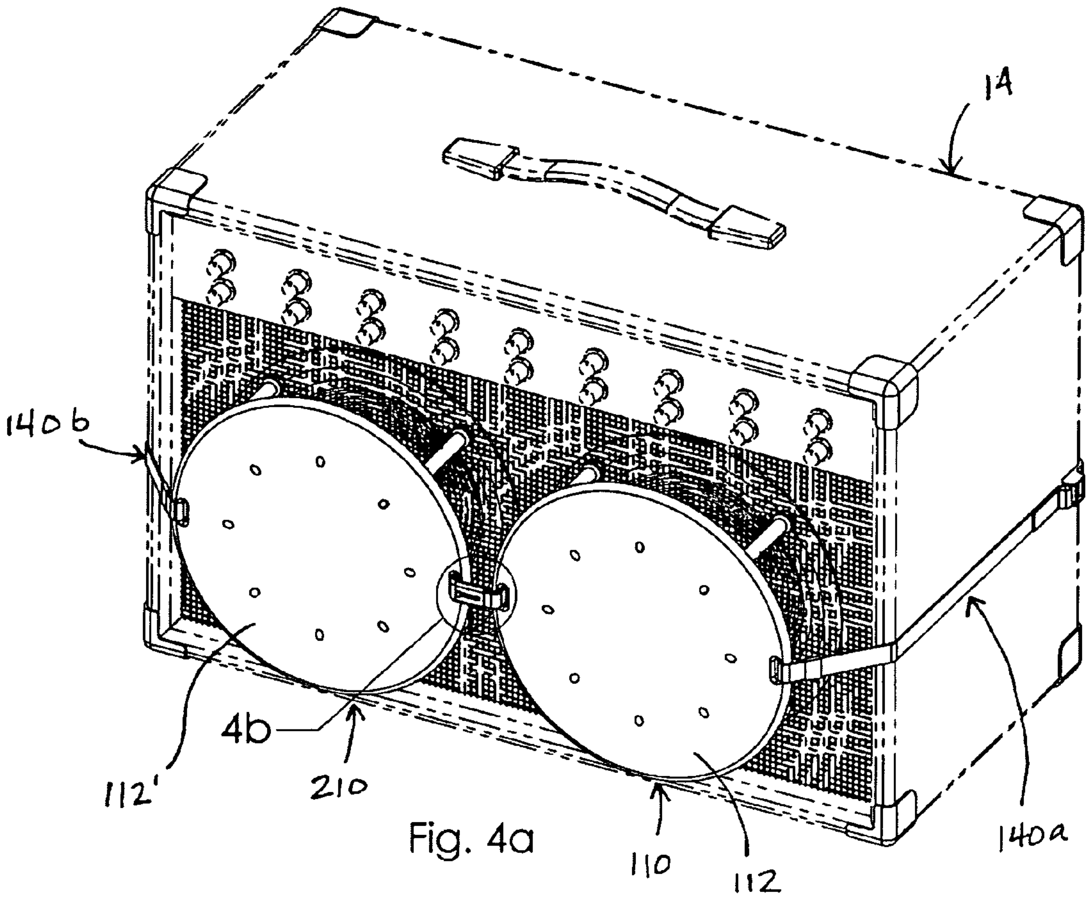
FIG. 4*a* is a perspective view of a pair of sound diffusers as in FIG. 1 in use on a speaker.

The first and second straps 140*a*, 140*b* operatively extend from the diffusing element 110 to connect the diffusing element 110 to a speaker case 14 (FIGS. 3 and 4*a*). In one embodiment, the first and second straps 140*a*, 140*b* operatively extend from the front plate 112, and the straps 140*a*, 140*b* have distal ends 142*a*, 142*b* with fasteners 144 for connection to the speaker case 14. The fasteners 144 may be hooks for fastening to a rear surface of the speaker case 14, as shown in FIG. 1, or any other appropriate fasteners. The first and second straps 140*a*, 140*b* may be length-adjustable straps. For example, as shown in FIG. 1, adjustment elements 145 (or any other appropriate adjustment mechanisms) may be included.

Figure 4B:
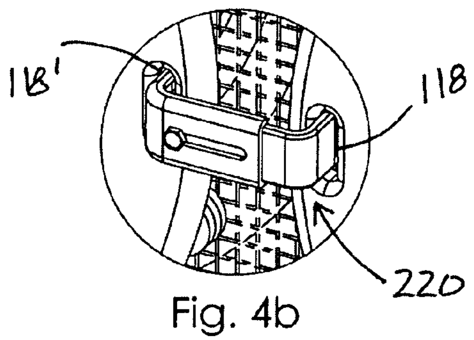
FIG. 4*b* is an isolated view on an enlarged scale taken from a portion of FIG. 4*a* illustrating a third strap.
Figure 4C:
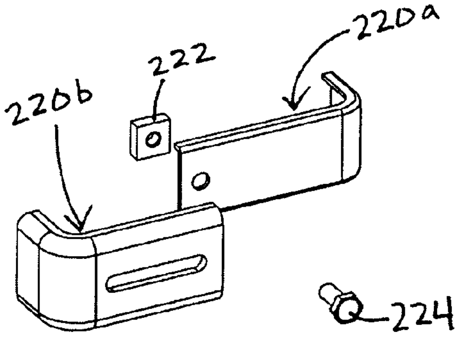
FIG. 4*c* is an exploded view of the third strap shown in FIG. 4*b.*
Figure 1:
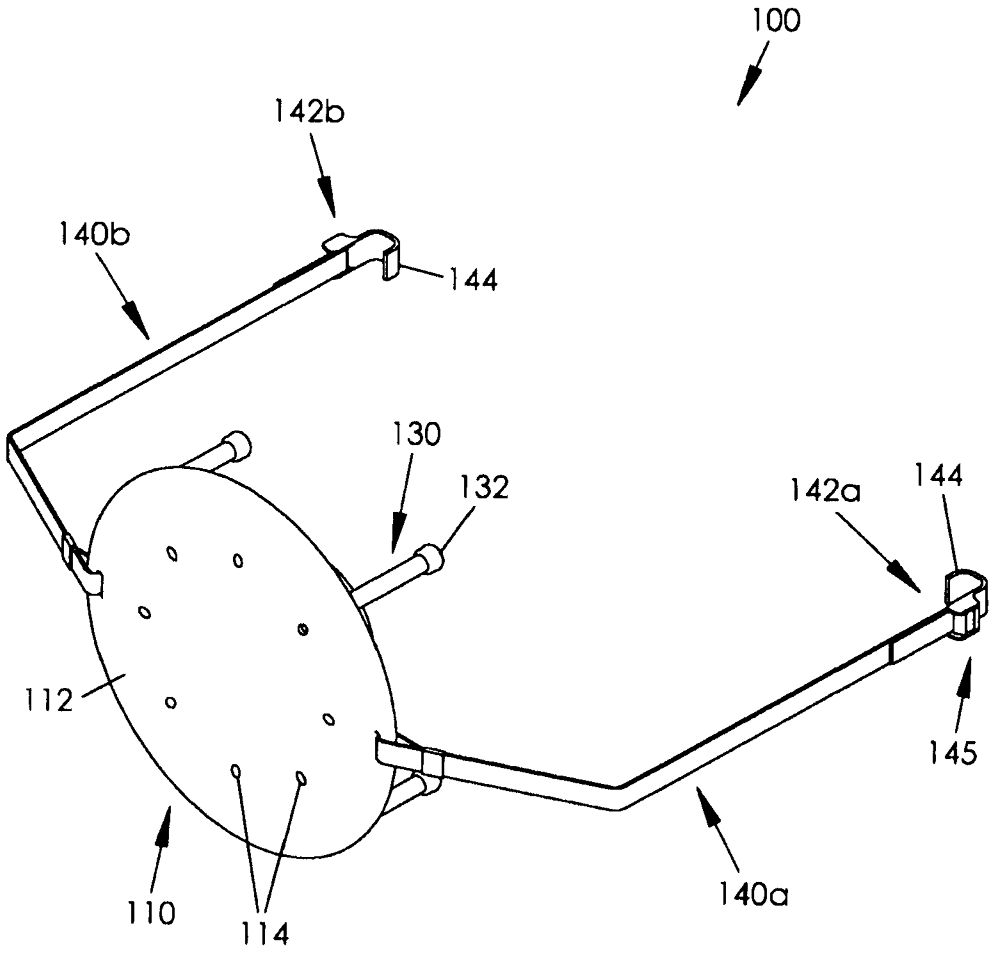
Figure 2A:
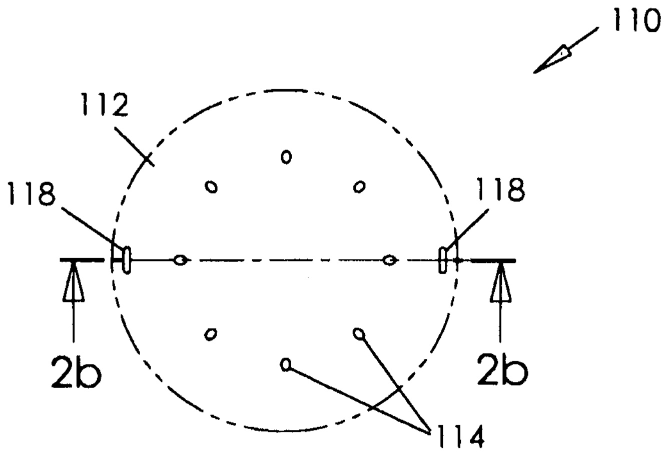
Figure 2B:
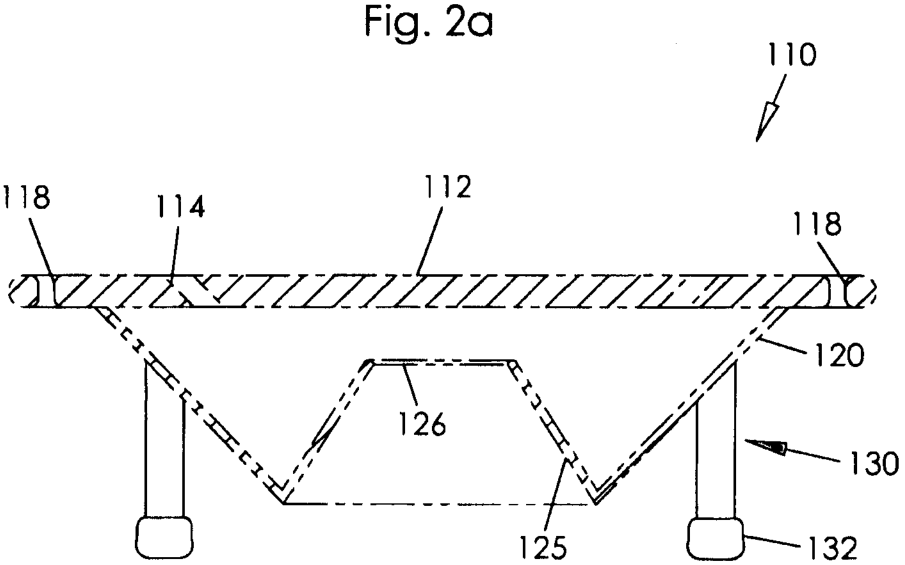
Figure 3:
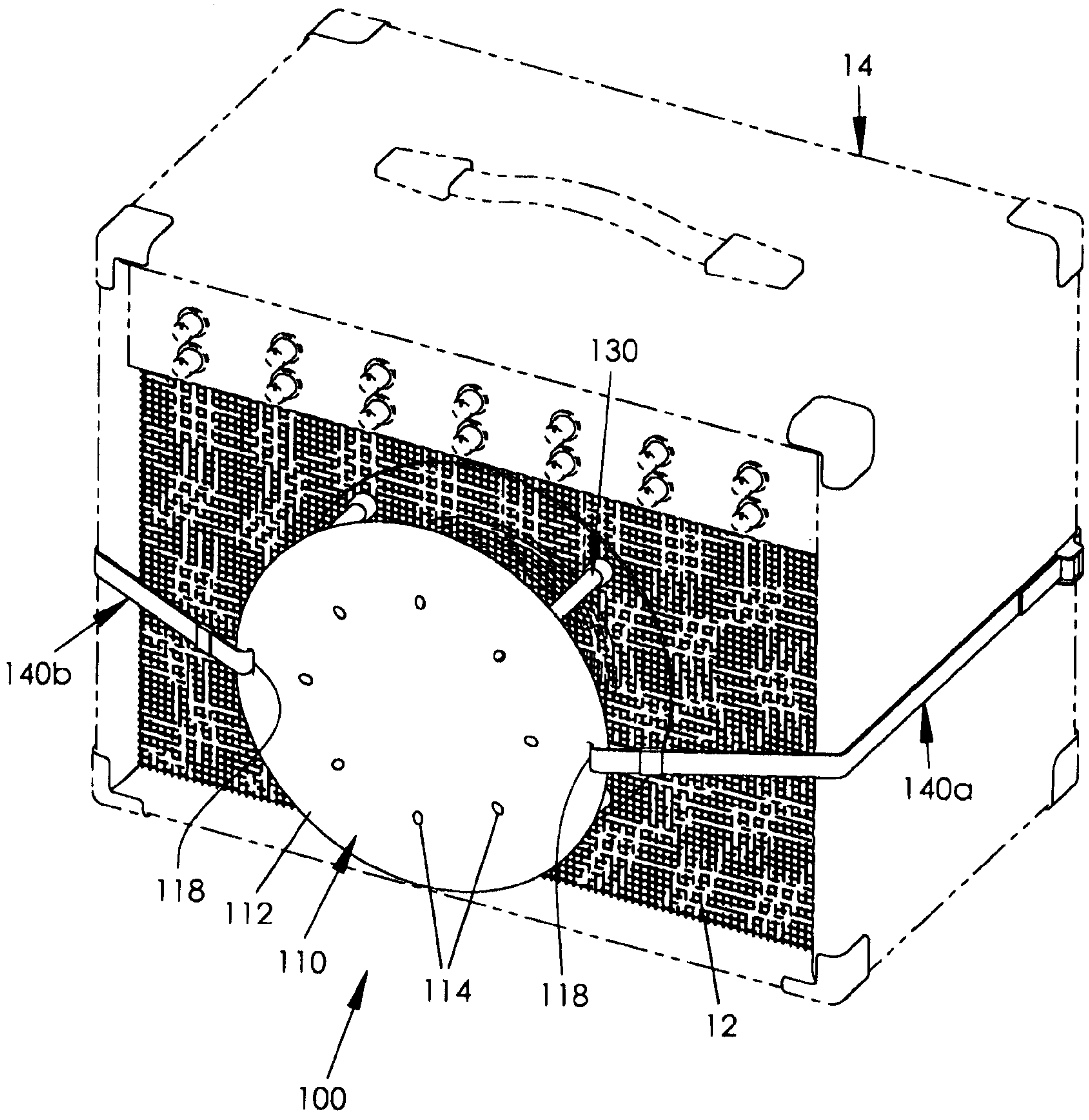
Figure 4A:
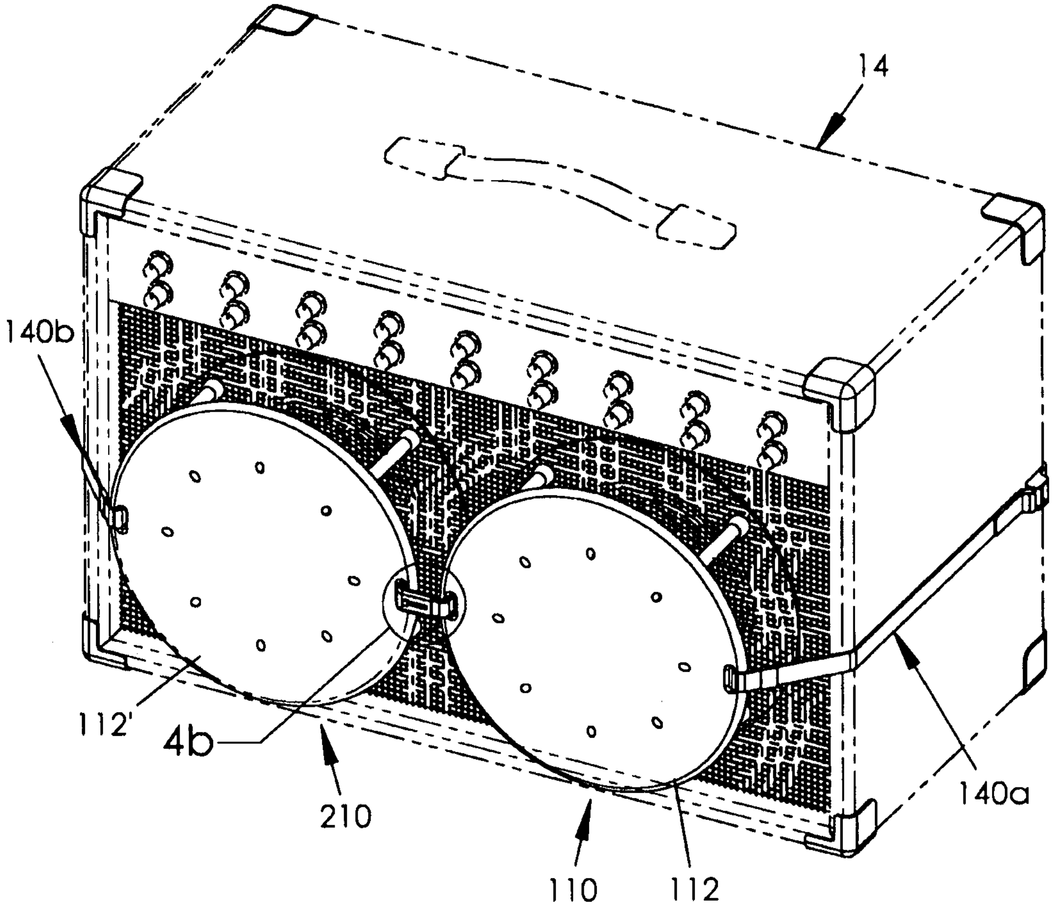
Figure 4B:
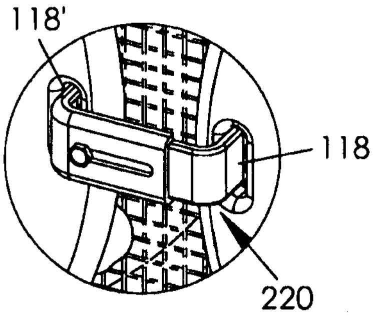
Figure 4C:
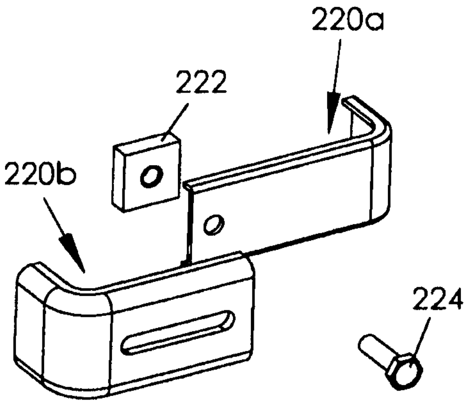

In one embodiment, the front plate 112 includes opposed slots 118 outside the outer wall 120. As shown in FIG. 1, the first strap 140*a* may be coupled to the front plate 112 by passing through one slot 118, and the second strap 140*b* may be coupled to the front plate 112 by passing through the other slot 118. Alternately, as shown in FIG. 4*a*, another diffusing element 210 substantially similar to (but separate from) the first diffusing element 110 described above may be included, and the first and second straps 140*a*, 140*b* may operatively extend from both diffusing elements 110, 210 to connect both diffusing elements 110, 210 to the speaker case 14. Similar components are referenced using primed reference numerals corresponding to the same characters referenced previously. The first strap 140*a* may be coupled to the first diffusing element 110 (e.g., by passing through a respective slot 118), the second strap 140*b* may be coupled to the second diffusing element 210 (e.g., by passing through a respective slot 118'), and a third strap 220 may couple the first diffusing element 110 to the second diffusing element 210 (e.g., by passing through respective slots 118, 118'). As shown in FIGS. 4*b* and 4*c*, the third strap 220 may be a length-adjustable strap. For example, a nut 222 and a bolt 224 may pass through separate portions 220*a*, 220*b* of the third strap 220 to maintain the separate portions 220*a*, 220*b* of the strap 220 at a desired position relative to one another.

In use, the diffusing element 110 is placed atop a speaker with the legs 130 contacting the speaker cover 12 (FIG. 3) so that the inner and outer walls 125, 120 are between the front plate 112 and the speaker cover 12. The straps 140*a*, 140*b* (and particularly the fasteners 144) are used to secure the diffusing element 110 to the speaker case 14, and the length of the straps 140*a*, 140*b* is adjusted as necessary. If the speaker case 14 includes two speakers, as shown in FIG. 4*a*, the second diffusing element 210 may be placed atop the other speaker, and the straps 140*a*, 140*b*, 220 (and particularly the fasteners 144) may be used to secure both diffusing elements 110, 210 to the speaker case 14 as discussed above. The strap 220 may be adjusted as set forth above to account for varying distances between the speakers in different speaker cases 14.

Sound from the speaker passes through the sound entry opening 126 and bounces between the front plate 112, the outer wall 120, and the inner wall 125 to dissipate any harsh tones. The sound then exits through the exit holes 114. Sound bouncing off the angled inner and outer walls 125, 120 and passing through the angled exit holes 114 may be broadcast (i.e., redistributed) throughout a room evenly over a wide listening angle. In other words, a person positioned directly in front of the speaker may not hear the sound differently than a person to the left or right of the speaker. The second diffusing element 210 may be used in the same manner as the first diffusing element 110 to cover another speaker and collectively provide the benefits of the diffusing elements 110, 210 to both speakers.

It is understood that while certain forms of this invention have been illustrated and described, it is not limited thereto except insofar as such limitations are included in the following claims and allowable functional equivalents thereof.

The invention claimed is:

1. A sound diffuser, comprising:
a front plate defining a plurality of sound exit holes;
an outer frustoconical wall extending from said front plate, said outer frustoconical wall decreasing in diameter from said front plate;
an inner frustoconical wall extending from said outer frustoconical wall toward said front plate, said inner frustoconical wall decreasing in diameter toward said front plate and defining a sound entry opening spaced apart from said front plate;
a plurality of legs coupled to at least one of said front plate and said outer frustoconical wall, said legs extending away from said front plate to contact a speaker cover;
first and second straps operatively extending from said front plate, said first strap having a distal end with a fastener for connection to a speaker case, said second strap having a distal end with a fastener for connection to said speaker case;
wherein:
said front plate is generally planar and said sound exit holes are uniformly spaced about a central point, said plurality of sound exit holes being arranged in a single ring having a singular radial distance from said central point;
said legs include flexible ends constructed of rubber;
said front plate, said outer frustoconical wall, and said inner frustoconical wall are constructed of sound-reflective material;
said inner frustoconical wall has an imaginary center axis; and
said sound entry opening is centered about said imaginary center axis and terminates said inner frustoconical wall;
each said sound exit hole is angled toward said sound entry opening.

2. The sound diffuser of claim 1, wherein:
said fasteners are hooks for fastening to a rear surface of said speaker case;
said first and second straps are length-adjustable straps;
said front plate includes opposed slots outside said outer frustoconical wall;
said first strap is coupled to said front plate by passing through one said slot; and
said second strap is coupled to said front plate by passing through another said slot.

3. The sound diffuser of claim 1, wherein said sound-reflective material is clear acrylic plastic.

4. The sound diffuser of claim 1, wherein said sound entry opening is generally parallel to said front plate and terminates said inner frustoconical wall.

5. The sound diffuser of claim 4, wherein:
said legs include flexible ends;
said fasteners are hooks for fastening to a rear surface of said speaker case;
said first and second straps are length-adjustable straps;
said front plate includes opposed slots outside said outer frustoconical wall; said first strap is coupled to said front plate by passing through one said slot; and said second strap is coupled to said front plate by passing through another said slot.

6. The sound diffuser of claim 5, wherein:
said front plate is generally planar and said sound exit holes are uniformly spaced about a central point;

said sound exit holes are angled toward said sound entry opening; and said front plate, said outer frustoconical wall, and said inner frustoconical wall are constructed of clear acrylic plastic.

7. A sound diffuser, comprising:

a front plate defining a plurality of sound exit holes;

an outer wall extending from said front plate, said outer wall decreasing in diameter from said front plate;

an inner wall extending from said outer wall toward said front plate, said inner wall decreasing in diameter toward said front plate and defining a sound entry opening spaced apart from said front plate, said sound entry opening being generally parallel to said front plate and terminating said inner wall;

a plurality of legs coupled to at least one of said front plate and said outer wall, said legs extending away from said front plate to contact a speaker cover with said inner and outer walls being between said front plate and said speaker cover;

first and second straps operatively extending from said front plate, said first strap having a distal end with a fastener for connection to a speaker case, said second strap having a distal end with a fastener for connection to said speaker case;

wherein:

said front plate is generally planar;

said legs include flexible ends;

said front plate, said outer wall, and said inner wall are constructed of sound-reflective material;

said sound entry holes are angled toward said sound entry opening;

said first and second straps being length-adjustable straps;

said front plate includes opposed slots outside said outer wall;

said first straps coupled to said front plate by passing through one said slot; and said second strap is coupled to said front plate by passing through another said slot.

* * * * *

UNITED STATES PATENT AND TRADEMARK OFFICE

CERTIFICATE OF CORRECTION

PATENT NO. : 7,669,692 B2
APPLICATION NO. : 12/017195
DATED : March 2, 2010
INVENTOR(S) : Hawkins It is certified that error appears in the above-identified patent and that said Letters Patent is hereby corrected as shown below:

Delete Title page, illustrating a figure(s), and substitute therefor, a new Title page illustrating a figure(s). (attached)

Delete drawing sheets 1-4, and substitute therefor drawing sheets 1-4. (attached)

Signed and Sealed this

Thirteenth Day of April, 2010

David J. Kappos

*Director of the United States Patent and Trademark Office*

(12) United States Patent
Hawkins

(10) Patent No.: US 7,669,692 B2
(45) Date of Patent: Mar. 2, 2010

(54) SOUND DIFFUSER

(76) Inventor: James W. Hawkins, 1703 1/2 - 256th St., Lomita, CA (US) 90717

( * ) Notice: Subject to any disclaimer, the term of this patent is extended or adjusted under 35 U.S.C. 154(b) by 32 days.

(21) Appl. No.: 12/017,195

(22) Filed: Jan. 21, 2008

(65) Prior Publication Data

US 2009/0183942 A1 Jul. 23, 2009

(51) Int. Cl.
*H05K 5/00* (2006.01)

(52) U.S. Cl. ........................ 181/155; 181/152; 181/148; 181/176

(58) Field of Classification Search ................. 181/155, 181/152, 148, 176
See application file for complete search history.

(56) References Cited

U.S. PATENT DOCUMENTS 3,679,022 A * 7/1972 Ohashi ........................ 181/199
4,133,975 A 1/1979 Barker, III
4,424,881 A * 1/1984 Hattori ........................ 181/155
5,115,882 A * 5/1992 Woody ........................ 181/144
5,641,106 A * 6/1997 Slaughter et al. ............ 224/324
6,009,972 A * 1/2000 Choi et al. .................. 181/155
6,257,365 B1 7/2001 Hulsebus, II
6,499,723 B1 * 12/2002 McNarry et al. ............ 254/213
7,466,837 B2 * 12/2008 Nakamura .................. 381/337
2005/0072625 A1 * 4/2005 Christenson ................ 181/210
2006/0018499 A1 * 1/2006 Guyot et al. ................ 381/347
2007/0064958 A1 * 3/2007 Nakamura ................ 381/71.1

* cited by examiner

*Primary Examiner* Jeffrey Donels
*Assistant Examiner*—Forrest M Phillips
(74) *Attorney, Agent, or Firm*—Dale J. Ream

(57) ABSTRACT

A sound diffuser includes a front plate defining a plurality of sound exit holes. An outer frustoconical wall extends from the front plate, the outer frustoconical wall decreasing in diameter from the front plate. An inner frustoconical wall extends from the outer frustoconical wall toward the front plate, the inner frustoconical wall decreasing in diameter toward the front plate and defining a sound entry opening spaced apart from the front plate. A plurality of legs are coupled to at least one of the front plate and the outer frustoconical wall, the legs extending away from the front plate to contact a speaker cover. First and second straps operatively extend from the front plate, the first strap having a distal end with a fastener for connection to a speaker case. The second strap also has a distal end with a fastener for connection to the speaker case.

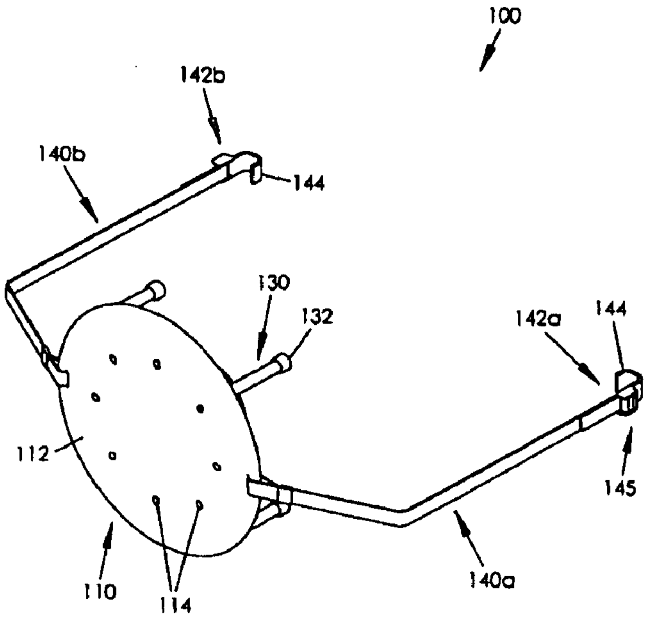

7 Claims, 4 Drawing Sheets